United States Patent
Tailliet et al.

(10) Patent No.: US 10,706,928 B2
(45) Date of Patent: Jul. 7, 2020

(54) NON-VOLATILE STATIC RANDOM ACCESS MEMORY ARCHITECTURE HAVING SINGLE NON-VOLATILE BIT PER VOLATILE MEMORY BIT

(71) Applicant: STMicroelectronics (Rousset) SAS, Rousset (FR)

(72) Inventors: Francois Tailliet, Fuveau (FR); Marc Battista, Allauch (FR)

(73) Assignee: STMicroelectronics (Rousset) SAS, Rousset (FR)

(*) Notice: Subject to any disclaimer, the term of this patent is extended or adjusted under 35 U.S.C. 154(b) by 0 days.

(21) Appl. No.: 16/043,425

(22) Filed: Jul. 24, 2018

(65) Prior Publication Data

US 2020/0035303 A1    Jan. 30, 2020

(51) Int. Cl.
| | | |
|---|---|---|
| *G11C 14/00* | (2006.01) | |
| *G11C 8/10* | (2006.01) | |
| *G11C 7/06* | (2006.01) | |
| *G11C 11/419* | (2006.01) | |
| *G11C 16/08* | (2006.01) | |
| *G11C 16/04* | (2006.01) | |
| *G11C 16/24* | (2006.01) | |

(52) U.S. Cl.
CPC .......... *G11C 14/0063* (2013.01); *G11C 7/06* (2013.01); *G11C 8/10* (2013.01); *G11C 11/419* (2013.01); *G11C 16/0433* (2013.01); *G11C 16/08* (2013.01); *G11C 16/24* (2013.01)

(58) Field of Classification Search
CPC ... G11C 5/141; G11C 14/0063; G11C 11/419; G11C 7/06; G11C 8/10; G11C 16/24; G11C 16/0433; G11C 16/08
See application file for complete search history.

(56) References Cited

U.S. PATENT DOCUMENTS

| | | | |
|---|---|---|---|
| 6,414,873 B1 | 7/2002 | Herdt | |
| 6,556,487 B1* | 4/2003 | Ratnakumar | G11C 14/00 365/154 |
| 9,099,164 B2* | 8/2015 | Erickson | G11C 5/005 |
| 9,502,110 B1* | 11/2016 | Tailliet | G11C 14/0063 |
| 9,779,814 B2* | 10/2017 | Wang | G11C 14/0063 |
| 2002/0163832 A1 | 11/2002 | Bertrand | G11C 16/0433 365/185.08 |
| 2006/0023503 A1* | 2/2006 | Lee | G11C 14/00 365/185.05 |
| 2008/0043516 A1 | 2/2008 | Dalton | |
| 2008/0101125 A1* | 5/2008 | Conte | G11C 16/12 365/185.18 |
| 2009/0190402 A1 | 7/2009 | Hsu et al. | |
| 2011/0261620 A1* | 10/2011 | Shih | G11C 14/0063 365/185.08 |

(Continued)

*Primary Examiner* — Mushfique Siddique
(74) *Attorney, Agent, or Firm* — Crowe & Dunlevy

(57) ABSTRACT

Disclosed herein is a method of operating a non-volatile static random access NVSRAM memory formed from words. Each word includes NVSRAM cells, each of those NVSRAM cells having an SRAM cell and an electronically erasable programmable read only memory EEPROM cell. If the SRAM cells of a word have been accessed since powerup, data is read from the NVSRAM cells of that word through the SRAM cells. However, if the SRAM cells of that word have not been written since powerup, data is read from the NVSRAM cells of that word through the EEPROM cells.

14 Claims, 11 Drawing Sheets

(56) References Cited

U.S. PATENT DOCUMENTS

| | | | |
|---|---|---|---|
| 2014/0369119 A1* | 12/2014 | Tailliet | G11C 16/0408 |
| | | | 365/185.08 |
| 2015/0269989 A1* | 9/2015 | Tailliet | G11C 11/41 |
| | | | 365/185.07 |
| 2016/0111159 A1* | 4/2016 | Tandingan | G11C 14/0063 |
| | | | 365/185.08 |
| 2017/0345505 A1* | 11/2017 | Noel | G11C 8/16 |
| 2018/0166139 A1* | 6/2018 | Hsu | G11C 14/0063 |

* cited by examiner

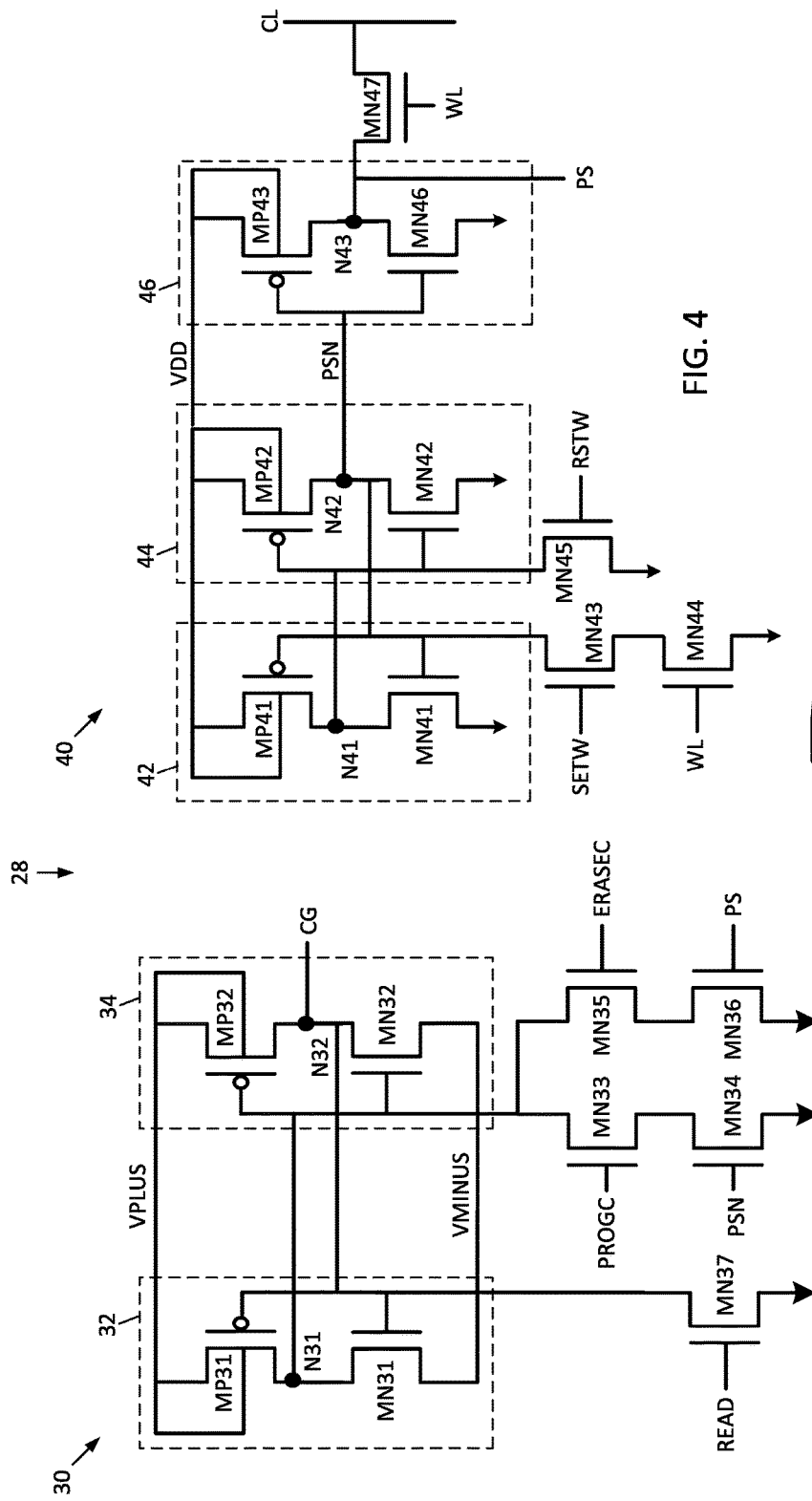

NON-VOLATILE STATIC RANDOM ACCESS MEMORY ARCHITECTURE HAVING SINGLE NON-VOLATILE BIT PER VOLATILE MEMORY BIT

TECHNICAL FIELD

This disclosure is directed to the field of non-volatile static random access memory (NVSRAM) architectures, and in particular, to a NVSRAM architecture having one non-volatile memory cell per volatile memory cell.

BACKGROUND

There are two main types of memory devices used in computers today, namely "non-volatile" and "volatile" memory devices. The name "non-volatile" comes from the fact that non-volatile memory devices maintain the data stored therein, even when power is removed or temporarily lost. It follows that the name "volatile" comes from the fact that volatile memory devices do not maintain the data stored therein when the power is removed or temporarily lost.

Common non-volatile memory devices include read only memory (ROM) devices, EPROM (erasable programmable ROM) devices, EEPROM (electrically erasable programmable ROM) devices, and flash RAM devices. Common volatile memory devices include dynamic random access memory (DRAM) and static random access memory (SRAM) devices. Volatile memory devices have been widely used for temporary data storage, such as during data manipulation, since writing data into or reading data out of these devices can be performed quickly and easily. However, a disadvantage of these volatile memory devices is that they require the constant application of power, and in some cases a data refresh signal, to maintain data stored in the memory cells. Once power supplied to the device is interrupted, the data stored in the memory cells is lost.

Non-volatile memory devices suffer from an endurance problem caused by repeated cycling of program and erase operations, as well as slower access speeds than volatile memory devices. SRAM devices have a fast data access speed and a long lifetime, and are therefore suitable for use in a computer system. However, since SRAM is a volatile memory device, the stored data stored will be lost if power is interrupted. Therefore, there was a recognized need to back up information stored in SRAM memories in the event of power failure.

Consequently, non-volatile static random access memory (NVSRAM) has been developed, which pairs each SRAM cell with two EEPROM cells so as to produce a device capable of storing the contents of the SRAM cell in the event of power loss and then retrieving of those contents when power is restored. Each EEPROM cell is comprised of a floating gate transistor that has a charge placed on its floating gate to modify the voltage threshold VT of that floating gate transistor, and this charge indicates the state of the binary data retained in that EEPROM cell.

Reference is made FIG. 1 showing a conventional 10T (ten transistor) NVSRAM cell 10. The NVSRAM cell 10 includes a 6T (six transistor) SRAM cell 12 formed from first and second cross coupled inverters 14 and 16 forming a latch that stores a data bit, with pass gate transistors MN3 and MN4 providing access to the stored data bit. First and second EEPROM strings 17 and 18 serve to back up the stored data bit if power loss is anticipated or expected, and then the data bit can be retrieved once power is restored.

The first inverter 14 is formed from PMOS transistor MP1 and NMOS transistor MN1. Transistor MP1 has its source coupled to the power supply line PS and its body coupled to the n-well line NW. Transistor MN1 has its drain coupled to the drain of transistor MP1, its source coupled to the NS line, and its gate coupled to the gate of transistor MP1.

The second inverter 16 is formed from PMOS transistor MP2 and NMOS transistor MN2. Transistor MP2 has its source coupled to the power supply line PS and its body coupled to the n-well line NW. Transistor MN2 has its drain coupled to the drain of transistor MP2, its source coupled to the NS line, and its gate coupled to the gate of transistor MP2. The gates of transistors MP2 and MN2 are coupled to the drains of transistors MP1 and MN1, and the gates of transistors MP1 and MN1 are coupled to the drains of transistors MP2 and MN2.

Pass gate NMOS transistor MN3 has its drain coupled to node N1 (at the drains of transistors MP1 and MN1), its source coupled to the bit line BL, and its gate coupled to the word line WL. Pass gate NMOS transistor MN4 has its drain coupled to node N2 (at the drains of transistors MP2 and MN2), its source coupled to the complementary bit line BLC, and its gate coupled to word line WL.

The first EEPROM string 17 is comprised of NMOS transistor MN5 in series with floating gate transistor EE1. The transistor MN5 has its drain coupled to node N1 and a gate coupled to the reload line RL. The floating gate transistor EE1 has its drain coupled to the source of transistor MN5, its source coupled to the EEPROM source line EES, and its gate coupled to the control gate line CGL.

The second EEPROM string 18 is comprised of NMOS transistor MN6 in series with floating gate transistor EE2. The transistor MN6 has its drain coupled to node N2 and its gate coupled to the reload line RL, and a source. The floating gate transistor EE2 has its drain coupled to the source of transistor MN6 and its source coupled to the EEPROM source line EES.

Operation of this circuit for writing data into and reading data from the SRAM cell 12 during standard operation is well known in the art and need not be described herein.

The storing of non-volatile data into the EEPROM cells (floating gate transistors EE1 and EE2) is accomplished by performing an erase operation followed by a program operation.

The erase operation operates as follows. The EES, NS, WL and RL lines are set to a logic low, isolating the floating gate transistors EE1 and EE2 from the SRAM 12. The n-well line NW and power supply line PS are set to VDD. The CGL line is then pulsed with a high voltage, for example 14V, erasing the contents of the floating gate transistors EE1 and EE2, putting them into an off state.

The program operation operates as follows. The EES, NS, WL, and RL lines are set to a logic low, while the n-well line NW is set to VDD and the power supply line PS is set to 5V. The CGL line is pulsed with −9V so that a cell storing a one sees 5−(−9)=14V and a cell storing a zero sees 0−(−9)=9V, while the RL line is then set to a logic high to connect the floating gate transistors EE1 and EE2 to the SRAM 12. The inverter 14 or 16 that is holding a logic high passes the logic high to the floating gate transistor EE1 or EE2 connected thereto, and the inverter 14 or 16 that is holding a logic zero passes the logic low to the floating gate transistor EE1 or EE2 connected thereto. While 14V at CGL is sufficient to program an EEPROM cell, 9V has a negligible effect and is insufficient to program an EEPROM cell. Therefore, the floating gate transistor EE1 or EE2 receiving a logic one is programmed, while the floating gate transistor EE1 or EE2 receiving a logic zero is not programmed. Thus, the data from the SRAM cell 12 is stored as non-volatile data.

The reloading of non-volatile data into the SRAM cell 12 upon power-up is as follows. The EEPROM source line EES and NS line are placed at a logic low, as is the word line WL. The CGL line is placed at a reference voltage Vref, typically around 0.5V to 1V. The n-well line NW and RL line are placed at VDD. The power supply line PS then ramps up. The RL line being at VDD turns on transistors MN5 and MN6, coupling the EEPROM cells (floating gate transistors EE1 and EE2) to nodes N1 and N2. The floating gate transistors EE1 and EE2 will be at different states, with one being "programmed" and containing the bit of stored data and the other being "erased". The floating gate transistor EE1 or EE2 that is programmed will draw more current than the one that is erased, which unbalances the cross coupled inverters 14 and 16, resulting in a flipping of the states of the inverters 14 and 16 to match that of the floating gate transistors EE1 and EE2, thereby reloading the SRAM cell 12 with the stored non-volatile data bit.

This NVSRAM cell 10 design is functional in ideal conditions. However, operating conditions are often less than ideal. The flipping of the states of the inverters 14 and 16 is controlled by the differential conductivity of the floating gate transistors EE1 and EE2. In an ideal case, the erased floating gate transistor EE1 or EE2 draws little to no current, while the programmed floating gate transistor EE1 or EE2 draws substantially more current than the erased floating gate transistor EE1 or EE2, facilitating the flip. However, in the non-ideal cases often present in real devices, both floating gate transistors EE1 and EE2 will draw some current. This may cause a current surge on the power supply during a reload operation. If multiple cells are reloaded at once, and total current surge prevents the power supply line PS from rising properly, this would leave the cells in metastable conditions, resulting in data corruption and chip malfunction. Another error may occur where both floating gate transistors EE1 and EE2 draw insufficient current, with the result being the length of time for the inverters 14 and 16 to flip becoming undesirable, or the inverters 14 and 16 in some cases not flipping.

In an attempt to mitigate these issues, some NVSRAM cells operate by reloading the SRAM cells in subgroups from the EEPROM cells upon powerup. However, the total time to perform this is on the order of tens of miliseconds, during which time the chip is not ready for use. This is not desirable. Therefore, further development is needed.

SUMMARY

Disclosed herein is a non-volatile static random access memory (NVSRAM) that has one non-volatile memory cell (one transistor) per volatile memory cell (two transistors).

A first embodiment is directed to a NVSRAM cell including a SRAM memory cell, a first gate selectively directly electrically coupling the SRAM memory cell to a bit line based upon a word level word line signal, a buffer circuit transferring a logic state of the SRAM memory cell to the bit line based upon a SRAM read word line signal, a singular EEPROM memory cell having a control terminal receiving a control gate signal, a second gate selectively directly electrically coupling the singular EEPROM memory cell to the bit line based upon an EEPROM read signal, and a third gate selectively directly electrically coupling the SRAM memory cell to the singular EEPROM memory cell based upon a reload signal.

A power source latch may be configured to generate a power source signal for powering the SRAM memory cell.

A control gate latch may be configured to generate the control gate signal, and may be configured to be set when either both of an erase signal and the power source signal are at a logic high or when both of a program signal and a complement of the power source signal are at a logic high. The control gate latch may be configured to be reset when a read signal is at a logic high.

The EEPROM memory cell may be a floating gate having a gate coupled to the control gate signal.

The power source latch may include a first latch configured to be set when a reset write signal is at a logic high and to be reset when both of a set signal and a word line for the SRAM memory cell are at a logic high, and an inverter having an input coupled to an output of the first latch, with the power source signal being generated at an output of the inverter.

The power source latch may include a first latch configured to be set when a reset write signal is at a logic high and to be reset when the word line signal is at a logic high, and an inverter having an input coupled to an output of the first latch, with the power source signal being generated at an output of the inverter.

Control logic may be configured to generate the word level word line signal and a reset signal for selectively resetting the SRAM memory cell as a function of the word line signal for the SRAM memory cell and a signal indicating whether a power source signal for powering the SRAM memory cell is at a logic high.

The SRAM memory cell may include first and second cross coupled inverters, with a reset transistor coupled between the output of the first inverter and ground. The buffer circuit may include a first buffering transistor having a drain coupled to the bit line, a source, and a gate coupled to a SRAM read word line, and a second buffering transistor having a drain coupled to the source of the first buffering transistor, a source coupled to ground, and a gate coupled to the output of the first inverter.

The SRAM memory cell may include first and second cross coupled inverters, and the first gate may include a PMOS gate selectively directly electrically coupling the SRAM memory cell to the bit line based upon a complement of a word level word line signal, and a NMOS gate selectively directly electrically coupling the SRAM memory cell to the bit line based upon the word level word line signal. The buffer circuit may include a first buffering transistor having a drain coupled to the bit line, a source, and a gate coupled to a SRAM read word line, and a second buffering transistor having a drain coupled to the source of the first buffering transistor, a source coupled to ground, and a gate coupled to the output of the first inverter.

Control logic may be configured to generate the word level word line signal and the complement of the word level word line signal as a function of a word line signal for the SRAM memory cell and a set signal.

A second embodiment is directed to a non-volatile static random access memory (NVSRAM) having a plurality of NVSRAM words. Each of the plurality of NVSRAM words includes a plurality of NVSRAM cells, with each of the plurality of NVSRAM cells having a SRAM memory cell, a first gate selectively directly electrically coupling the SRAM memory cell to a bit line based upon a word level word line signal and a complement of the word level word line signal, a singular EEPROM memory cell having a control terminal receiving a control gate signal, a second gate selectively directly electrically coupling the singular EEPROM memory cell to the bit line based upon an EEPROM read signal, and a third gate selectively directly electrically coupling the SRAM memory cell to the singular EEPROM memory cell based upon a reload signal. A buffer circuit may include a first buffering transistor having a drain coupled to the bit line, a source, and a gate coupled to a SRAM read word line, and a second buffering transistor having a drain coupled to the source of the first buffering transistor, a source coupled to ground, and a gate coupled to the output of the first inverter.

Each of the plurality of NVSRAM cells may include a power source latch configured to generate a power source signal for powering the SRAM memory cell.

Each of the plurality of NVSRAM cells may include a control gate latch configured to generate the control gate signal.

The control gate latch may be configured to be set when both of an erase signal and the power source signal are at a logic high, and may be configured to be reset when a read signal is at a logic high.

The control gate latch may be configured to be set when both of a program signal and a complement of the power source signal are at a logic high, and may be configured to be reset when a read signal is at a logic high.

The EEPROM memory cell may be a floating gate having a gate coupled to the control gate signal.

A third embodiment disclosed herein is a a method of operating a non-volatile static random access memory (NVSRAM) comprising a plurality of words, each of the plurality of words having a plurality of NVSRAM cells, and each of the plurality of NVSRAM cells including a singular SRAM cell and a singular electronically eraseable programmable read only memory (EEPROM) cell. The method includes steps reading the given word by reading each singular EEPROM cell of each of the plurality of NVSRAM cells of the given word, if a given word has not undergone a volatile write command since powerup, and reading the given word by reading each singular SRAM cell of each of the plurality of NVSRAM cells of the given word, if the given word has undergone a volatile write command since powerup.

Reading each singular EEPROM cell may include, for that singular EEPROM cell, coupling the singular EEPROM cell to a bit line through a dedicated EEPROM sense amplifier for that singular EEPROM cell.

Prior to reading the given word, the NVSRAM may be powered up but the plurality of words are not powered or initialized.

The method may include writing data to the singular SRAM cells of the plurality of NVSRAM cells of the given word through a SRAM write interface, and reloading the singular SRAM cells of the plurality of NVSRAM cells of the given word, in response to selection of that given word, with the reloading being performed by powering the given word and coupling the singular EEPROM cells of the plurality of NVSRAM cells of the given word to respective singular SRAM cells of the plurality of NVSRAM cells of the given word through the SRAM write interface.

BRIEF DESCRIPTION OF THE DRAWINGS

FIG. 3 is a schematic diagram of a control gate latch within word switch circuitry for use with the NVSRAM cell of FIG. 2.

FIG. 4 is a schematic diagram of a power source latch within the word switch circuitry for use with the NVSRAM cell of FIG. 2.

FIG. 5 is a schematic diagram of control logic within the word switch circuitry for use with the NVSRAM cell of FIG. 2.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

An improved NVSRAM cell and NVSRAM array containing such improved NVSRAM cells, control techniques for the improved NVSRAM array, and generation of control signals for the improved NVSRAM array will be described below in detail. First however, the improved NVSRAM array can be described, in general as follows, as will be understood by those of skill in the art.

The NVSRAM cell includes a single SRAM cell and a single (not a pair of) EEPROM cell. The EEPROM cell is not read by circuitry outside of the NVSRAM cell through connections to the SRAM cell, but instead through an EEPROM sense amplifier external to the NVSRAM cell, and external to the memory array to which the NVSRAM cell belongs.

In an array constructed from such NVSRAM cells, the NVSRAM bit cells are physically grouped by words. A specific EEPROM control gate signal for each word is generated by a dedicated word switch for that word. The dedicated word switches also control the power supplied to the SRAM cells.

At chip powerup, no SRAM cells in any words are powered up or initialized. Instead, the SRAM cells of a given word are powered up when they are first needed. Since the word switch for a given word powers the SRAM cells of that word, and since the SRAM cells for that word are not powered until needed a first time after chip powerup, the state of the word switch indicates whether the SRAM cells of that word have been accessed since powerup. Therefore, if the SRAM cells of that word have been accessed since powerup, data is read from the NVSRAM cells of that word through the SRAM cells. However, if the SRAM cells of that word have not been written since powerup, data is read from the NVSRAM cells of that word through the EEPROM cells.

Note that data is not reloaded from the EEPROM cells into the SRAM cells. Instead, after powerup or power on reset, a first read to a given NVSRAM cell results in a read of its EEPROM cell, through standard SRAM read circuitry. Subsequent reads of that NVSRAM cell also result in a read of its EEPROM cell until such time as the SRAM cell is written to, after which subsequent reads will be of the SRAM cell. Also note that if the SRAM cells of a given word have not been accessed since powerup, a store operation (that would write data from a SRAM cell to its associated EEPROM cell) will not be performed despite such a command being issued for that word.

The detailed description of the NVSRAM array will now be given.

Figure 1:
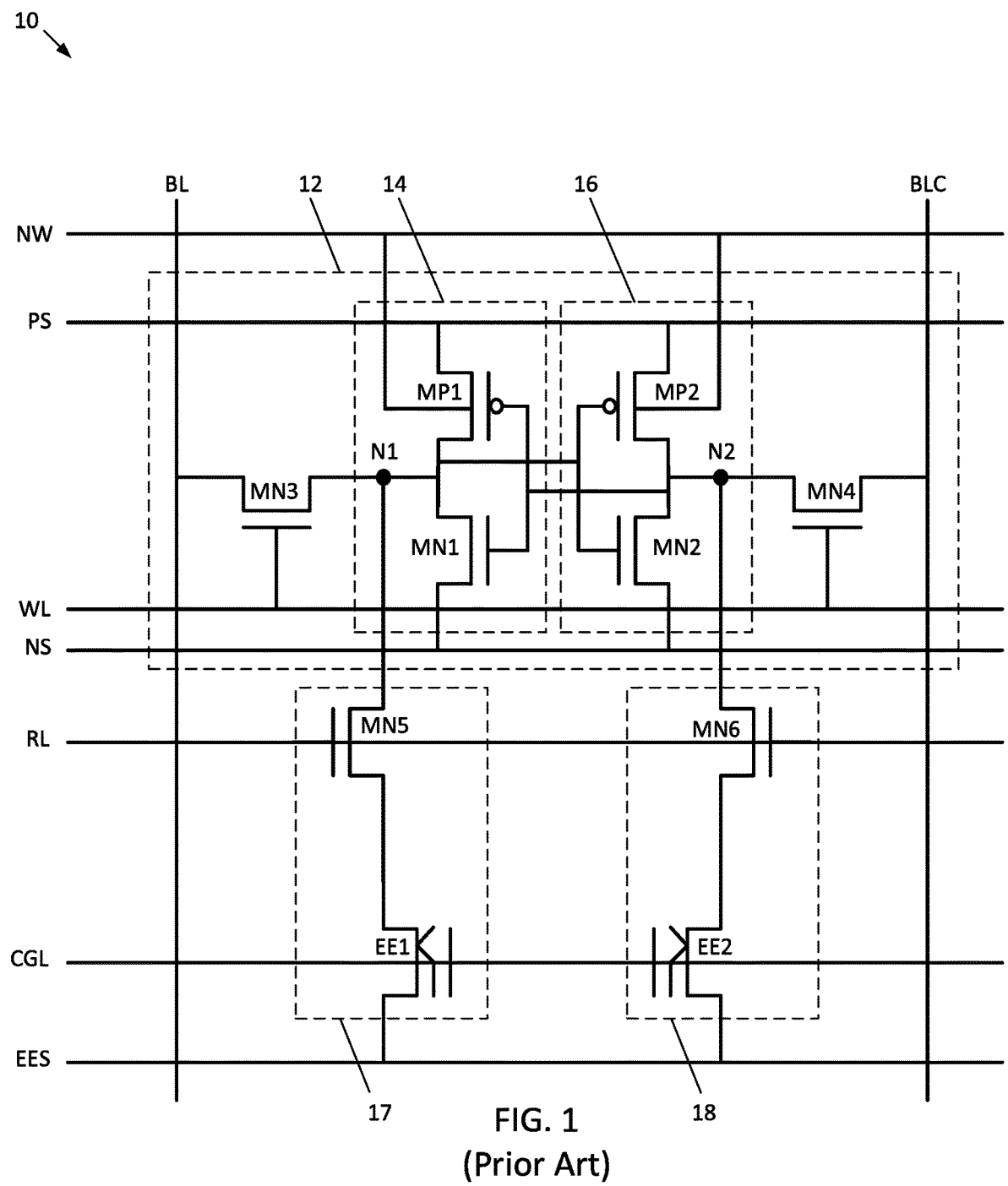
FIG. 1 is a schematic diagram of a known NVSRAM cell.
Figure 2:
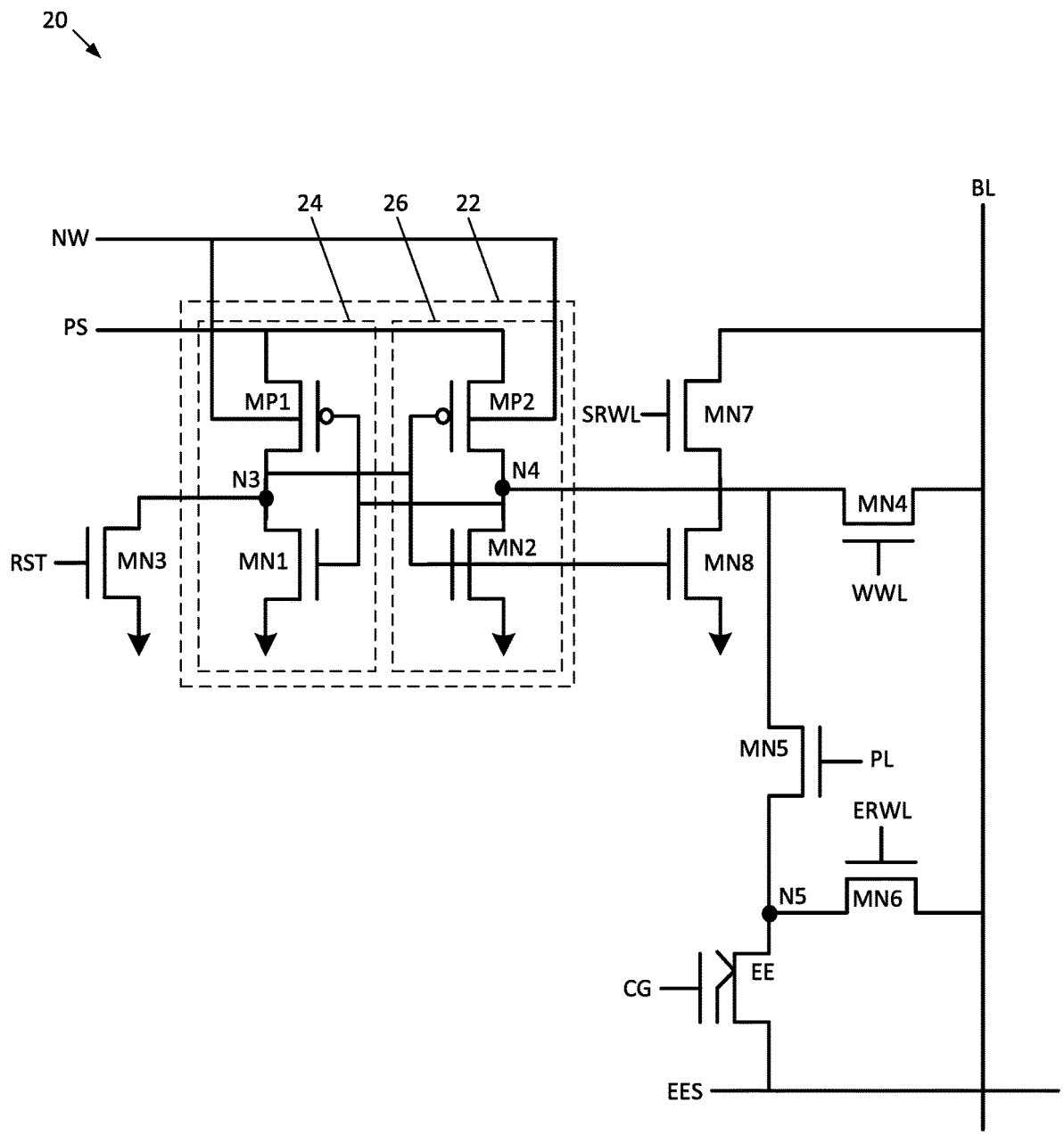
FIG. 2 is a schematic diagram of a NVSRAM cell disclosed herein.

The schematic for the NVSRAM cells 20 of this disclosure is shown in FIG. 2. First the structure of the NVSRAM cells 20 will be described, and then operation will be discused.

Each NVSRAM cell 20 includes a SRAM 22 cell comprised of two cross coupled inverters 24 and 26 forming a latch. The inverter 24 is comprised of PMOS transistor MP1 and NMOS transistor MN1. Transistor MP1 has its source coupled to the power supply line PS, its drain coupled to node N3, and its body coupled to the n-well line NW. Transistor MN1 has its drain coupled to node N3 and its source coupled to ground. The inverter 26 is comprised of PMOS transistor MP2 and NMOS transistor MN2. Transistor MP2 has its source coupled to the power supply line PS, its drain coupled to node N4, and its body coupled to the n-well line NW. Transistor MN2 has its drain coupled to node N4 and its source coupled to ground. The gates of transistors MP1 and MN1 are coupled to node N4, while the gates of transistors MP2 and MN2 are coupled to node N3.

Reset NMOS transistor MN3 has its drain coupled to node N3, its source coupled to ground, and its gate coupled to the reset line RST. NMOS transistor MN4 has its drain coupled to node N4, its source coupled to the bitline BL, and its gate coupled to the word-level word line WWL. NMOS transistor MN5 has its drain coupled to node N4, its source coupled to node N5, and its gate coupled to the program line PL. NMOS transistor MN6 has its drain coupled to node N5, its source coupled to the bitline BL, and its gate coupled to the EEPROM read word line ERWL. NMOS transistor MN7 has its drain coupled to the bitline BL and its gate coupled to the SRAM read word line SRWL. NMOS transistor MN8 has its drain coupled to the source of NMOS transistor MN7, its source coupled to ground, and its gate coupled to node N3. Floating gate transistor EE has its drain coupled to node N5, its source coupled to the EEPROM source line EES, and its gate coupled to the control gate line CG.

Word switch circuitry 28 is now described with reference to FIGS. 3-5. The word switch circuitry 28 includes a control gate latch 30 configured to generate the control gate signal CG, a power source latch 40 configured to generate the PSN, PS, and CL signals, and control circuitry 50 configured to generate the RST and WWL signals.

The control gate latch 30 is now described with reference to FIG. 3. The control gate latch 30 includes cross coupled inverters 32 and 34. The inverter 32 includes PMOS transistor MP31 and NMOS transistor MN31. The transistor MP31 has its source and body coupled to the VPLUS line and its drain coupled to node N31. The transistor MN31 has its drain coupled to node N31 and its source coupled to the VMINUS line. The gates of transistors MP31 and MN31 are coupled to node N32. The inverter 34 includes PMOS transistor MP32 and NMOS transistor MN32. The transistor MP32 has its source and body coupled to the VPLUS line and its drain coupled to node N32. The transistor MN32 has its drain coupled to node N32 and its source coupled to the VMINUS line. The gates of transistors MP32 and MN32 are coupled to node N31.

NMOS transistor MN33 has its drain coupled to node N31 and its gate coupled to the program line PROGC. NMOS transistor MN34 has its drain coupled to the source of transistor MN33, its source coupled to ground, and its gate coupled to the PSN line. NMOS transistor MN35 has its drain coupled to node N31 and its gate coupled to the erase line ERASEC. NMOS transistor MN36 has its drain coupled to the source of transistor MN35, its source coupled to ground, and its gate coupled to the power supply line PS. NMOS transistor MN37 has its drain coupled to node N32, its source coupled to ground, and its gate coupled to the read line READ. The PROGC and PSN signals being at a logic high, or the ERASEC and PS signals being at a logic high, serves to set the control gate latch 30. The READ signal serves to reset the latch. Note that the control gate signal CG is generated at node N32.

The power source latch 40 is now described with reference to FIG. 4. The power source latch 40 includes cross coupled inverters 42 and 44, as well as an inverter 46 coupled in series with the output of inverter 44. Inverter 42 is comprised of PMOS transistor MP41 and NMOS transistor MN41. The transistor MP41 has its source and body coupled to VDD and its drain coupled to node N41. The transistor MN41 has its drain coupled to node N41 and its source coupled to ground. The gates of transistors MP41 and MN41 are coupled to node N42. The inverter 44 includes PMOS transistor MP42 and NMOS transistor MN32. The transistor MP42 has its source and body coupled to VDD and its drain coupled to node N42. The transistor MN42 has its drain coupled to node N42 and its source coupled to ground. The gates of transistors MP42 and MN42 are coupled to node N41.

NMOS transistor MN43 has its drain coupled to node N42 and its gate coupled to the SETW line. NMOS transistor MN44 has its drain coupled to the source of transistor MN43, its source coupled to ground, and its gate coupled to the word line WL. NMOS transistor MN45 has its drain coupled to node N41, its source coupled to ground, and its gate coupled to the RSTW line. Note that the power supply line PS is produced at node N43 and its inverse PSN is produced at node N42. The RSTW signal being at a logic high sets the latch formed from inverters 42 and 44 (and therefore resets the power source latch 40), while the SETW and WL lines being high resets the latch formed from inverters 42 and 44 (and therefore sets the power source latch).

Inverter 46 is comprised of PMOS transistor MP43 and NMOS transistor MN46. PMOS transistor MP43 has its source and body coupled to VDD and its drain coupled to node N43. NMOS transistor MN46 has its drain coupled to node N43 and its source coupled to ground. The gates of transistors MP43 and MN46 are coupled to node N42.

NMOS transistor MN47 has its drain coupled to node N43, its source coupled to the column line CL, and its gate coupled to the word line WL.

The control circuitry 50 is now described with reference to FIG. 5. The control circuitry 50 includes NOR gates 52, 54, and 56. NOR gate 52 has inputs coupled to the word line WL and column line CL. NOR gate 54 has inputs coupled to the RESETN line and to the output of NOR gate 52. NOR gate 56 has inputs coupled to the WRITEN line and to the output of NOR gate 52. The reset signal RST is produced at the output of NOR gate 54, and the word level word line WWL signal is produced at the output of NOR gate 56.

Operation of the NVSRAM array will now be described, but first, the terms for different operations performed on the NVSRAM array are defined. A "write" is a writing of data to the SRAM cells of a word; a "read" is a reading of data from the EEPROM cells or SRAM cells of a word, depending upon whether a write has yet been performed to the SRAM cells; and a "store" is an "erase" operation performed on the EEPROM cells of a word followed by a "programming" operation on those EEPROM cells. An "erase" operation wipes stored data from the EEPROM and renders it ready to receive new data, and a "programming" operation is an operation during which data from the SRAM cells of a word is stored in the EEPROM cells of that word. Note that this NVSRAM array does not perform a conventional "reload" operation, in which data from the EEPROM cells of a word is loaded into the SRAM cells of that word upon powerup.

Operation of the NVSRAM array including multiple NVSRAM cells 20 is now described. Upon device powerup or a power on reset, a reload operation is not performed as in the prior art, but instead read operations are performed from the EEPROM cells EE of the NVSRAM calls 20 until such time as a write has been performed to those NVSRAM cells.

Figure 2A:
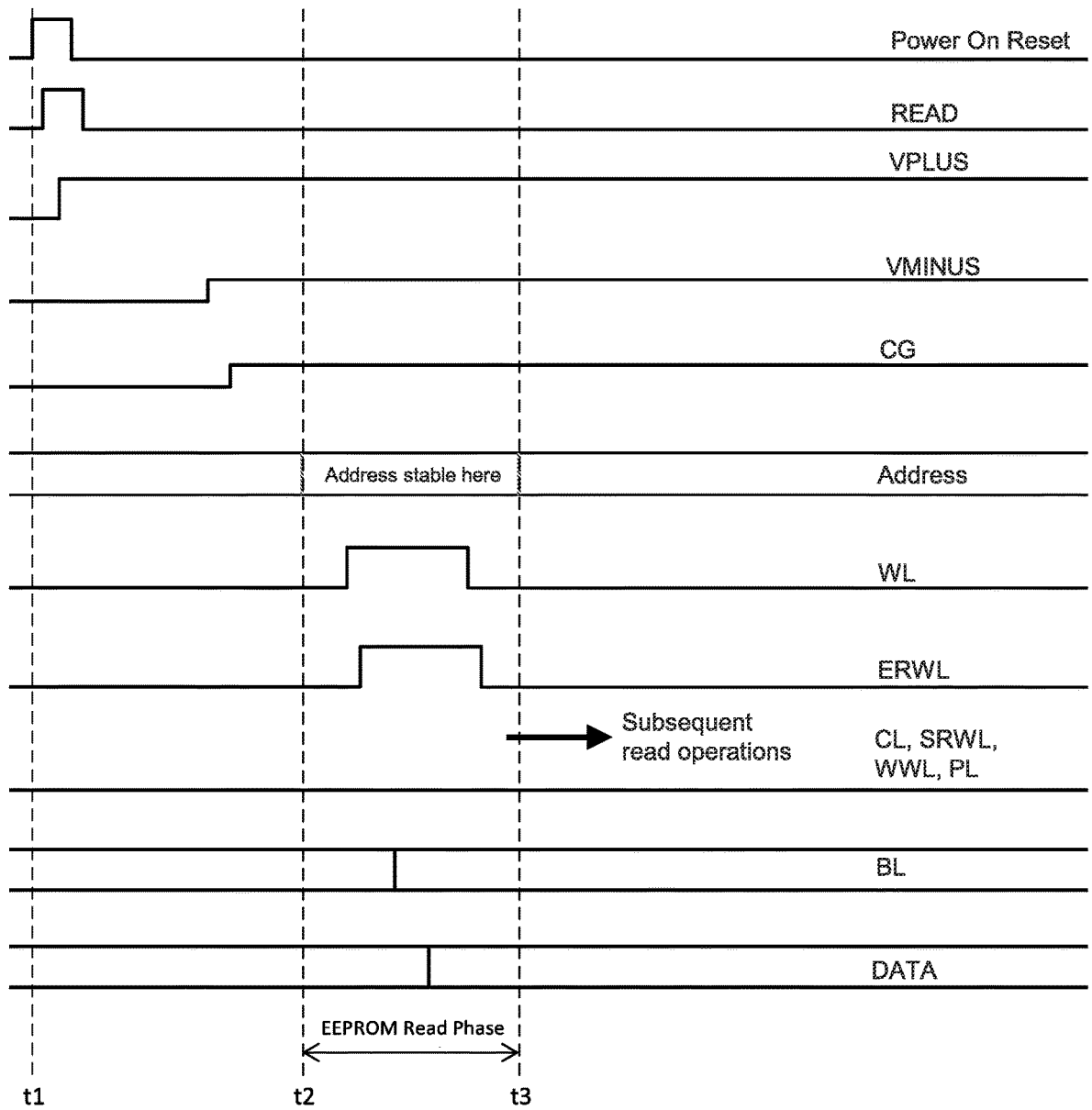
FIG. 2A is a timing diagram of the NVSRAM cell of FIG. 2 when performing an initial read operation on the EEPROM cell of the NVSRAM cell after powerup.

Referring now to the schematics in FIGS. 2 and 3, and the timing diagram in FIG. 2A, an initial read of the EEPROM cell EE is now described. Note that the initial read is performed on demand and not automatically. Upon the device powerup or power on reset, the power on reset signal pulses, with the pulse rising at time t1 to begin an initial read setup phase. The CG, PL, and EES lines are initally set to a logic low; CG and EES being low has the effect of maintaining the data stored in the floating gate transistor EE, while PL being low has the effect is disconnecting the floating gate transistor EE from the SRAM cell 22. The EEPROM read word line ERWL, the SRWL line, and the word-level word line WWL are initially set to a logic low.

The read line READ then pulses at a logic high, while VPLUS rises to VDD. This powers up the control gate latch 30 of each word in the NVSRAM array. Note that the program line PL remains low during this initial read.

VMINUS is set to an EEPROM read voltage, such as 0.5V. The read line READ being at a logic high turns on the transistor MN37 of each control gate latch 30, and resetting each control gate latch 30 so that inverter 34 outputs a logic low (VMINUS) to node N32, and inverter 32 outputs a logic high (VPLUS). Thus, the control gate line CG of each control gate latch 30 is set to VMINUS and remains there until chip deselect At time t2, the address to read from has become properly decoded and is stable, so the read operation can begin and the initial read setup phase ends. Therefore, the read path of one column of the NVSRAM array is connected to all bit lines of the word being read. The WL line is pulsed, allowing the CL line to follow the PS line. Note that since WL is global to a full row, when WL is pulsed, the CL of each column is connected to the PS line of all word switches 40 of that row. The relevant CL is selected by the column decoder (reference 110 in FIG. 10, as later explained below) for reading.

The EEPROM read word line ERWL is set to as a function of the selected CL. CL being low, as it is in this example means that PS is low and the SRAM cell 22 of the NVSRAM cell 20 is unpowered. Therefore, ERWL will be set high, which has the effect of connecting the floating gate transistor EE (FIG. 2) to the bitline BL so that the data stored in the floating gate transistor EE is read. At time t3, the address to read from changes for the next read operation, so the read operation described ends.

Subsequent reads of the NVSRAM cell 20, prior to a write operation, are simply performed by pulsing the EEPROM read word line ERWL to a logic high, while the other described signals not described as pulses are maintained at their same voltage levels. Had CL been high, then the read of the floating transistor EE would not be performed, and instead the SRAM cell 22 would be read. Thus, had CL been high, SRWL would have risen, and ERWL would have remained low.

Figure 2B:
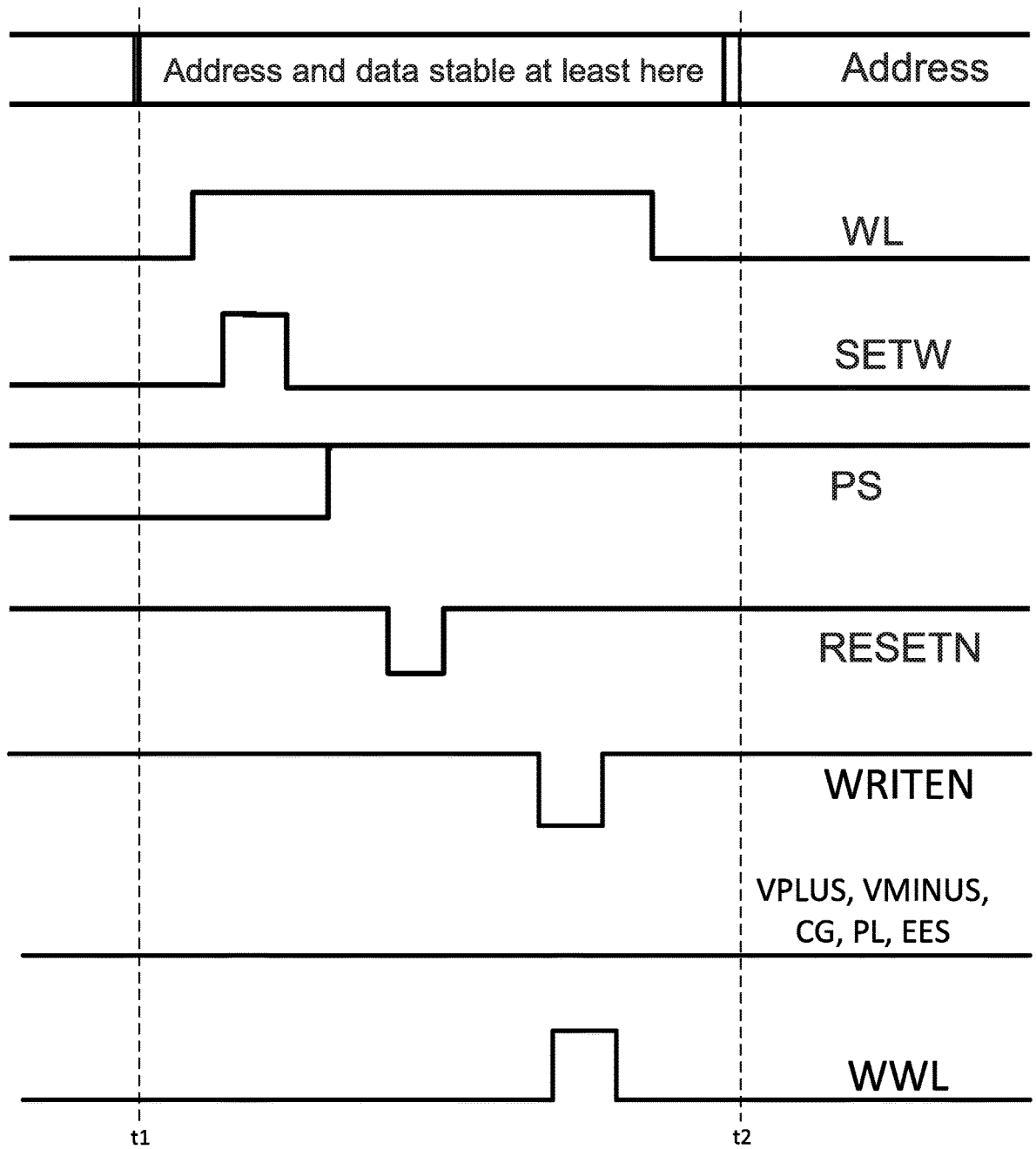
FIG. 2B is a timing diagram of the NVSRAM cell of FIG. 2 when performing a write operation on the SRAM cell of the NVSRAM cell.

A write operation performed on a word of NVSRAM cells 20 in the NVSRAM array is now described with reference to the schematics in FIGS. 2 and 3, and the timing diagram of FIG. 2B. At time t1, initially, the SRWL and ERWL lines are low. The address to write is then properly decoded, and the logic value to write to the SRAM cell 22 is present on the bitline BL. The control gate line CG, program line PL, and EEPROM source line EES are at or set to ground. If a write had previously been performed, the power source line PS would already be at VDD at the beginning of the write operation, but otherwise would be at ground at the beginning of the write operation. The word line WL then rises to a logic high, and shortly after, the SETW signal pulses. SETW and WL both being at a logic high sets the inverter 42 of the power source latch 40 to output a logic high at node N41, with the result being that the inverter 44 outputs a logic low at node N42, and that the inverter 46 in turn outputs the power source signal PS at a logic high at node N43. Therefore, if PS were not already at a logic high (meaning that a write has not yet been performed since device powerup or power on reset), PS is now pulled to a logic high.

The RESETN signal is then pulled briefly to a logic low. Since WL will be at a logic high at this time, the NOR gate 52 will output a logic low, and the NOR gate 54 will output the reset signal RST at a logic high. The reset signal RST going to a logic high resets the SRAM cell 22.

The WRITEN signal is then pulsed to a logic low. Since the NOR gate 52 is outputting a logic low, the NOR gate 56 will output the word level word line WWL as a logic high. This turns on NMOS transistor MN4 in the NVSRAM cell 20, with the result being that the SRAM cell 22 is set according to the value at the bit line BL.

An alternative write operation that can be performed on a word of NVSRAM cells 20 in the NVSRAM array is now described. The logic value to write to the SRAM cell 22 is present on the bitline BL. The control gate line CG, program line PL, and EEPROM source line EES are set to a logic low; CG and EES being low has the effect of maintaining the data stored on the floating gate transistor EE, while PL being low serves to disconnect the floating gate transistor EE from the SRAM cell 22. The write line WL transitions to a logic high.

Then, the RSTW line is pulsed with a logic high. This results in the inverter 44 of the power source latch 40 generating its output at node N42 at a logic high, and thus the inverter 46 pulling the power supply line PS low to turn off the SRAM cell 22 during the pulse of the RSTW line. Once the power supply line PS goes low, then RESETN goes low, and RST goes high.

Then, the SETW signal is pulsed with a logic high. Since the write line WL will be at a logic high at this time, this has the effect of causing the inverter 42 of the power source latch 40 to pull its output at node N41 high, which results in the inverter 44 pulling its output at node N42 low, and thus the inverter 46 pulling its output PS at node N43 high, powering the SRAM cell 22 back up. Once PS goes high, RESETN goes high and RST goes low. Note that powering up (transitioning PS high) while RST is high consumes less power than pulsing RST while PS is already high.

Since WL is still at a logic high, the NOR gate 52 will output a logic low. The WRITEN signal is pulsed to a logic low, with the result being that the NOR gate 56 pulls the word level word line WWL high, thereby turning on the NMOS transistor MN4 in the NVSRAM cell 20, with the result being that the SRAM cell 22 is set according to the value at the bit line BL. The write ends at time t2.

Figure 2C:
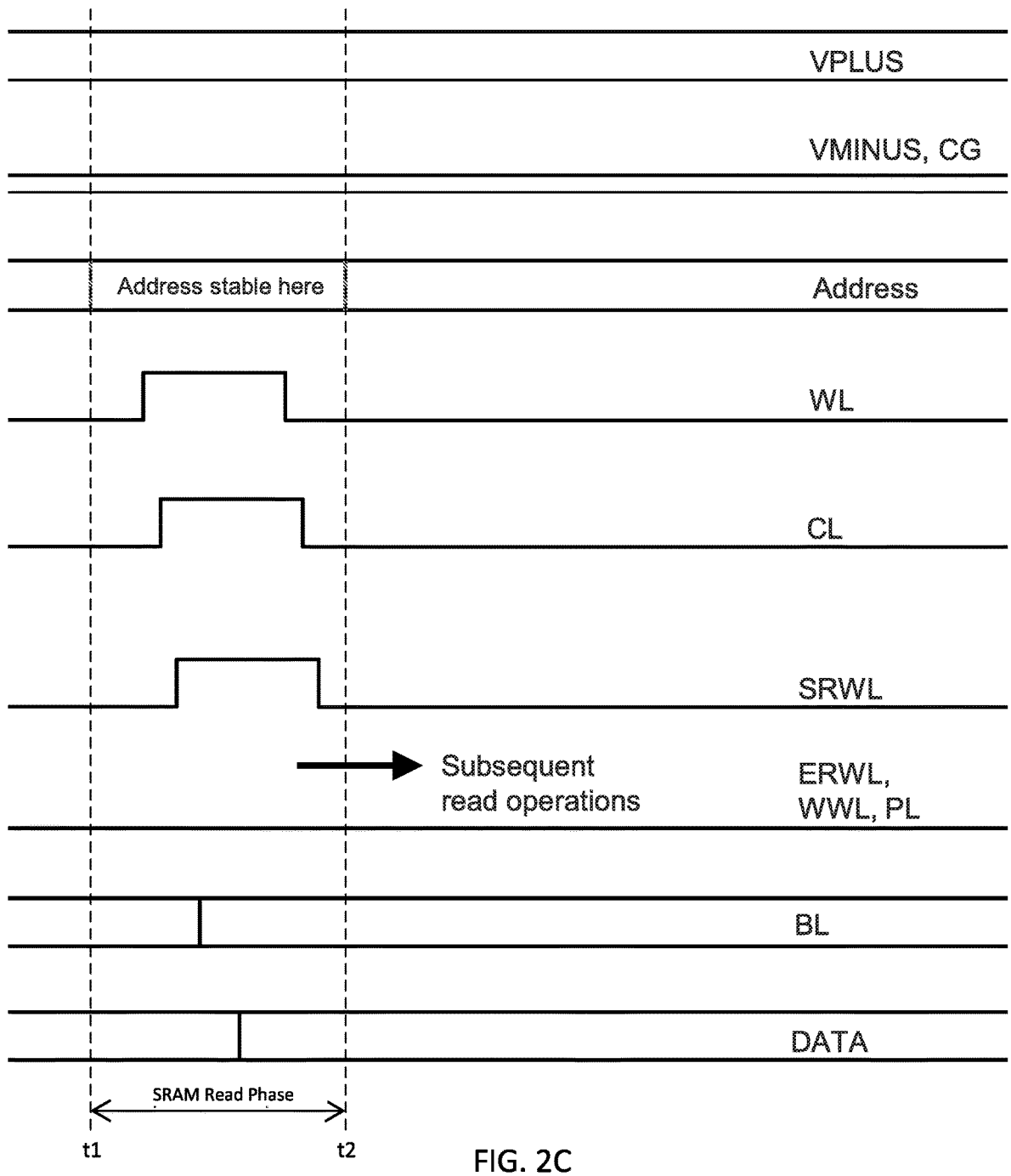
FIG. 2C is a timing diagram of the NVSRAM cell of FIG. 2 when performing a read operation on the SRAM cell of the NVSRAM.

A read operation performed on a word of NVSRAM cells 20 in the NVSRAM array, once a write has already been performed (so the read is from the SRAM cells) is now described with reference to the schematics in FIGS. 2 and 3, and the timing diagram of FIG. 2C. To read, the CG, PL, and EES lines are set to a logic low; CG and EES being low has the effect of maintaining the data stored in the floating gate transistor EE, while PL being low has the effect is disconnecting the floating gate transistor EE from the SRAM cell 22. The SRAM read word line SRWL is initially at a logic low, as is the EEPROM read word line ERWL.

At time t1, the address to read from has become properly decoded and is stable, so the read operation can begin. Therefore, the read path of one column of the NVSRAM array is connected to all bit lines of the word being read. The word line WL transitions to a logic high. The result of the word line WL transitioning to a logic high is to turn on transistor MN47, connecting the CL line to the PS line, permit readout of the current state of the PS line. If the PS line is at a logic high, as it is in this example, CL will follow the PS line and rise.

Shortly after WL and CL rise, the SRWL line rises, turning on transistor MN7, coupling transistor MN8 to the bitline BL. The state of the transistor MN8 follows that of the SRAM cell 22. Therefore, when transistor MN7 is switched on, that state can be read through bitline BL. This results in the logic level of the bit line BL following that of the SRAM cell 22, which is read. The read cycle ends at t2. The advantage to this design and this read cycle is that the risk of parasitic flipping of the SRAM cell 22 during a read operation is eliminated.

Figure 2D:
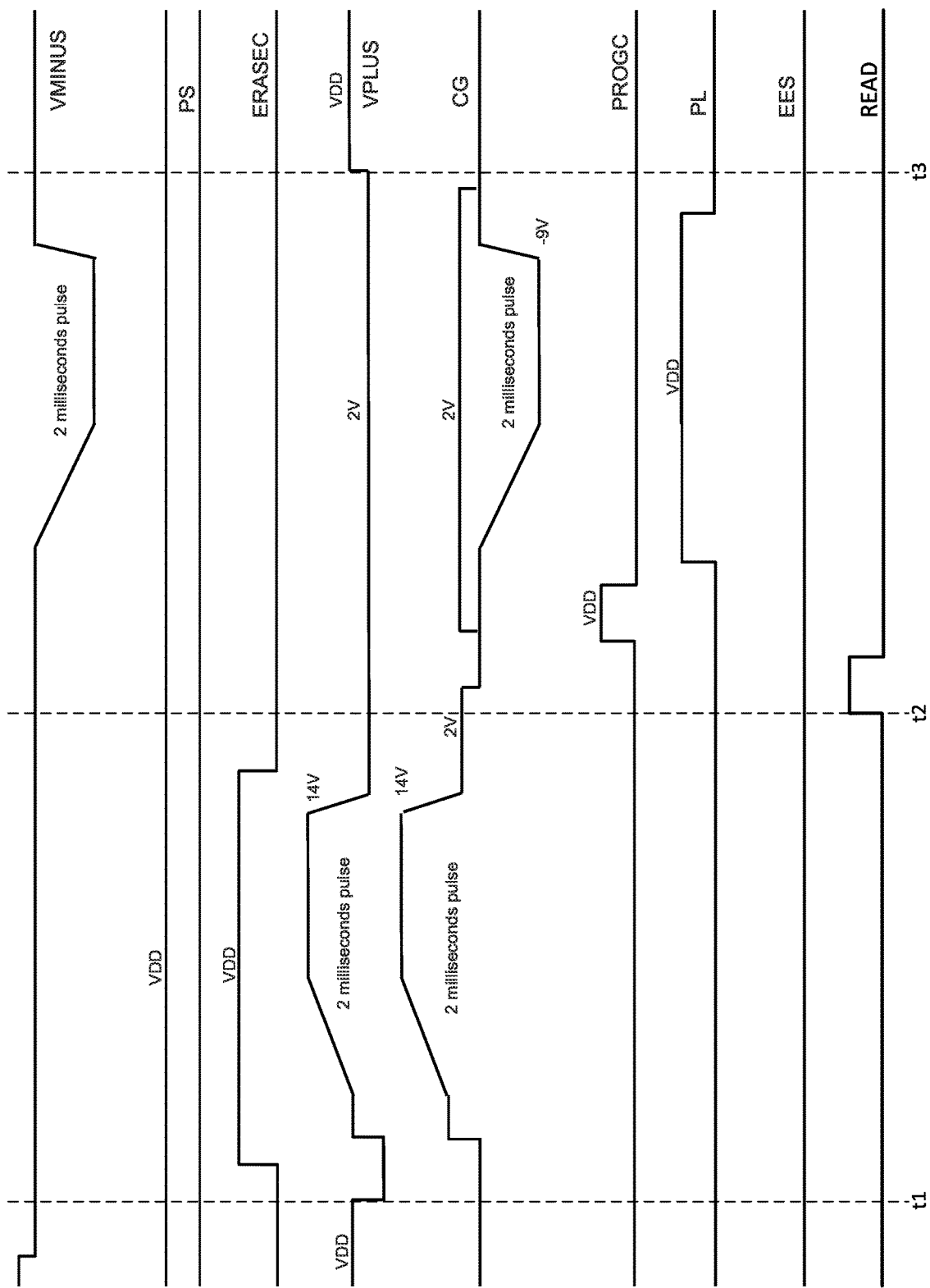
FIG. 2D is a timing diagram of the NVSRAM cell of FIG. 2 when performing a store operation on the EEPROM cell of the NVSRAM.

A store operation performed on a word of NVSRAM cells 20 is now described with reference to the schematics of FIGS. 2 and 3, and the timing diagram of FIG. 2D. As explained, a store operation includes an erase operation followed by a programming operation. Note that if the SRAM cells 22 of a word not been written to since powerup (indicated by the column line CL being at a logic low), a commanded store operation will not be performed, as there is nothing to store.

For the erase operation, the EES, SRWL, PL, and ERWL lines will be set to a logic low, and the RESETN and WRITEN lines will be set to a logic high; ERWL being low has the effect of disconnecting the floating gate transistor EE from the bitline BL; PL has being low has the effect of disconnecting the floating gate transistor EE from the SRAM cell 22; RESETN being high has the effect of causing RST to be pulled low, and WRITEN being high has the effect of causing WWL to be pulled low. RST being low has the effect of preventing the SRAM cell 22 from being reset, while WWL being low has the effect of disconnecting the SRAM cell 22 from the bitline BL.

The erase operation begins at time t1. The VMINUS and VPLUS lines are set to a logic low, and the erase line ERASEC is thereafter set to VDD. If the column line CL is at a logic high, the power supply line PS is at VDD, and the result of the erase line ERASEC being set to VDD is to pull the CG line to VPLUS. The VPLUS line will then be ramped to an erase voltage (e.g. 14V) for the floating gate transistor EE, with the result being that the control gate line CG also ramps to the erase voltage. The floating gate transistor EE is then erased. Thereafter, the VPLUS line ramps down to a voltage below a logic high but above ground, such as 2V. The control gate line CG follows.

Then, the READ line is pulsed to a logic high at time t2, ending the erase operation, and beginning the program operation. The READ line being pulsed to a logic high causes reset of the CG line to follow VMINUS.

For each word of the NVSRAM array that is not selected for the store operation, the power source line PS is set or remains low, with PSN accordingly being high. Then, a pulse for PROGC shortly after time t2 will set the control gate latch 30, and the control gate line CG will go to VPLUS, which will be 2V in this instance, since the VPLUS line ramped down to 2V at the end of the erase operation.

For each word of the NVSRAM array that is selected for the store operation, the power source line PS is high, with PSN accordingly being low. Therefore, when the pulse on the PROGC line occurs shortly after time t2, the control gate latch 30 is unaffected, due to PSN keeping transistor MN34 off. Then the control gate line CG is set to follow the VMINUS line, and VMINUS is ramped down to −9V while PL transitions high, having the effect of copying the data stored in the SRAM 22 to the floating gate transistor EE. At the end of the store operation, the sequence is reversed, ending the store operation. The program operation ends at time t3.

A NVSRAM array constructed from the NVSRAM cells 20 described above has the advantage of a reload operation that is not susceptible to falling into a metastable state, as not every NVSRAM cell 20 is reloaded at once. Since a reload opereation is not automatically performed on powerup, there is no latency at powerup, and the NVSRAM cells 20 are immediately available for reading or writing upon powerup. Since reloads are only performed when necessary (when a given word is selected), power consumption is reduced. In addition, since a program operation will not be performed on words that have not executed a write operation since powerup, power consumption is further reduced. Still further, this design enables multiple concurrent randomly addressed store operations, and does not require a store operation to be performed on a full page of NVSRAM cells. In addition, there is minimal risk of data flipping, and the layout is compact.

It should be appreciated that error correction codes can be used with the NVSRAM array, such as Hamming codes. Indeed, any read/write error management techniques used for EEPROM can be used with the NVSRAM array.

Figure 6:
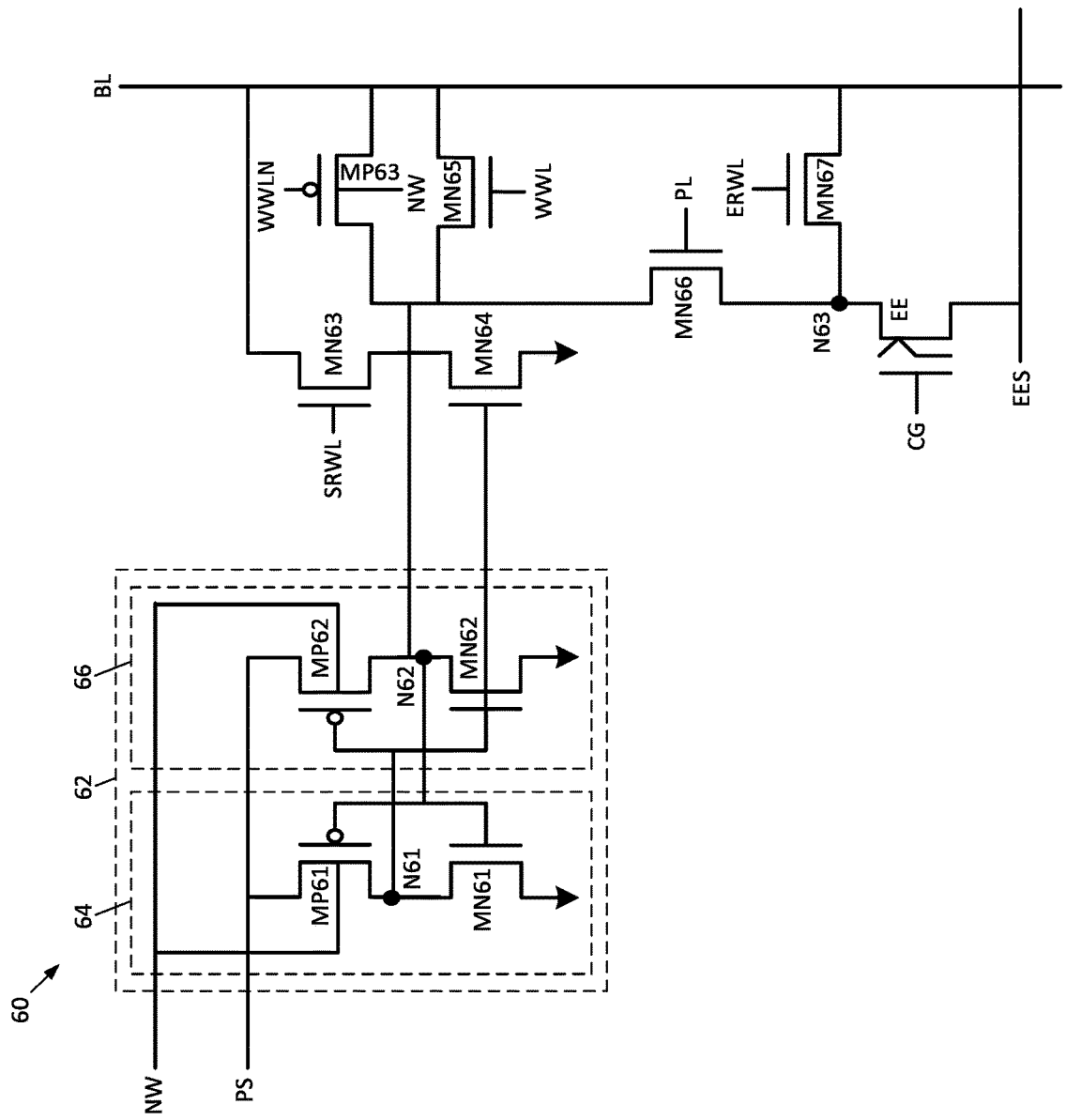
FIG. 6 is a schematic diagram of an alternative design of a NVSRAM cell disclosed herein.

An alternate design for a NVSRAM cell 60 is shown in FIG. 6. The NVSRAM cell 60 includes a SRAM cell 62 comprised of cross coupled inverters 64 and 66. The inverter 64 includes PMOS transistor MP61 and NMOS transistor MN61. Transistor MP61 has its source coupled to the power supply line PS, its body coupled to the n-well line NW, and its drain coupled to node N61. Transistor MN61 has its drain coupled to node N61 and its source coupled to ground. The gates of transistors MP61 and MN61 are coupled to node N62. The inverter 66 includes PMOS transistor MP62 and NMOS transistor MN62. Transistor MP62 has its source coupled to the power supply line PS, its body coupled to the n-well line NW, and its drain coupled to node N62. Transistor MN62 has its drain coupled to node N62 and its source coupled to ground. The gates of transistors MP62 and MN62 are coupled to node N61.

NMOS transistor MN63 has its drain coupled to the bit line BL and its gate coupled to the SRWL line. NMOS transistor MN64 has its drain coupled to the source of transistor MN63, its source coupled to ground, and its gate coupled to node N61. PMOS transistor MP63 has its source coupled to node N62, its drain coupled to the bitline BL, its body coupled to the n-well line NW, and its gate coupled to the complement of the word level word line WWLN. NMOS transistor MN65 has its drain and source coupled to the source and drain of transistor MP63 to form a transfer gate, and its gate coupled to the word level word line WWL.

NMOS transistor MN66 has its drain coupled to node N62, its source coupled to node N63, and its gate coupled to the program line PL. NMOS transistor MN67 has its drain coupled to node N63, its source coupled to the bitline BL, and its gate coupled to the EEPROM read word line ERWL.

Floating gate transistor EE has its drain coupled to node N63, its source coupled to the EEPROM source line EES, and its gate coupled to the control gate line CG.

While this NVSRAM cell 60 design operates as the NVSRAM cell 30 described above, it is noted that with this design, it is possible to set the SRAM cell 62 concurrently with its own powerup, minimizing power consumption and supply noise. It is noted that this NVSRAM cell 60 design lacks a reset transistor.

Figure 7:
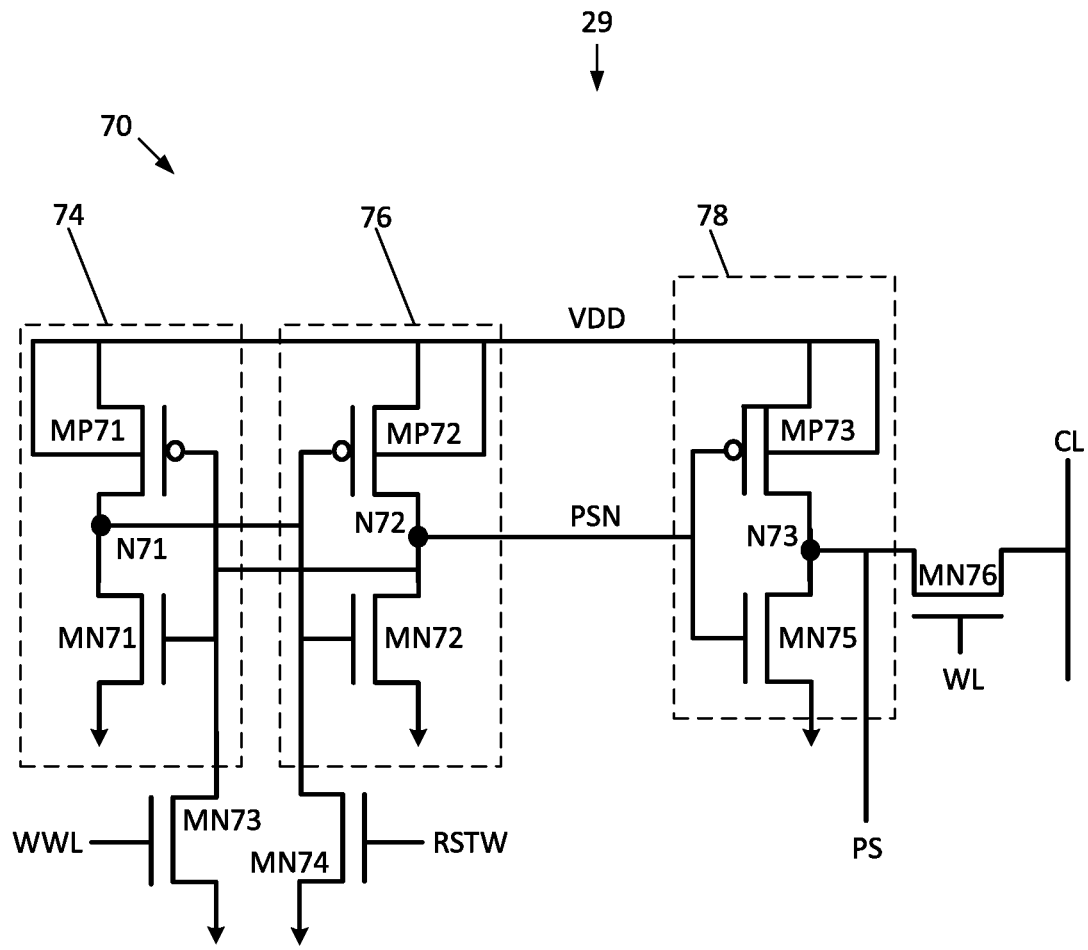
FIG. 7 is a schematic diagram of a design of a power source latch within alternative word switch circuitry for use with the NVSRAM cell of FIG. 6.

An alternate design for word switch circuitry 29 usable with the NVSRAM cell 60 is now described with reference to FIG. 7. The word switch circuitry 29 is comprised of the control gate latch 30 (FIG. 3), power source latch 70, and control circuitry 80.

The power source latch 70 includes cross coupled inverters 74 and 76 forming a latch. The inverter 74 includes PMOS transistor MP71 and NMOS transistor MN71. The transistor MP71 has its source and body coupled to VDD and its drain coupled to node N71. The transistor MN71 has its drain coupled to the drain of transistor MP71 and its source coupled to ground. The gates of transistors MP71 and MN71 are coupled to node N72. The inverter 76 includes PMOS transistor MP72 and NMOS transistor MN72. The transistor MP72 has its source and body coupled to VDD and its drain coupled to node N72. The transistor MN72 has its drain coupled to node N72 and its source coupled to ground. The gates of transistors MP72 and MN72 are coupled to node N71. NMOS transistor MN73 has its drain coupled to node N72, its source coupled to ground, and its gate coupled to the word level word line WWL. NMOS transistor MN74 has its drain coupled to node N71, its source coupled to ground, and its gate coupled to the RSTW line. The word level word line WWL being at a logic high resets the latch formed from inverters 74 and 76 and thus sets the power source latch 70, while RSTW being at a logic high sets the latch formed from inverters 74 and 76 and thus resets the power source latch 70. Note that the inverse of the power source signal PSN is produced at node N72.

The power source latch 70 circuitry also includes inverter 78 having its input coupled to node N72 to thereby produce the power source signal PS at its output. Inverter 78 includes PMOS transistor MP73 and NMOS transistor MN75. Transistor MP73 has its source and body coupled to VDD and its gate coupled to node N72. Transistor MN75 has its source coupled to ground, and its gate coupled to node N72. The drains of transistors MP73 and MN75 are coupled to node N73. NMOS transistor MN76 has its drain coupled to node N73, its source coupled to the column line CL, and its gate coupled to the word line WL. Note that the power source signal PS is produced at node N73.

Figure 8:
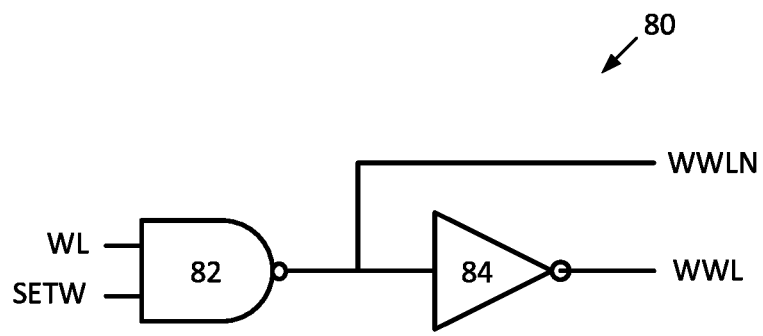
FIG. 8 is a schematic diagram of design of control logic within the alternative word switch circuitry for use with the NVSRAM cell of FIG. 6.

The control signal generation circuit 80 is now described with reference to FIG. 8. The control signal generation circuit 80 includes NAND gate 82 and inverter 84. The NAND gate 82 has inputs coupled to the word line WL and the SETW line, and provides its output to inverter 84. The WWLN signal is produced at the output of the NAND gate 82, and the WWL signal is produced at the output of the inverter 84.

An advantage of using the alternative NVSRAM design 60 together with its word switch 29 is that fewer transistors are used, reducing area consumption by seven transistors compared to the NVSRAM design 30 and its word switch 28.

Figure 9:
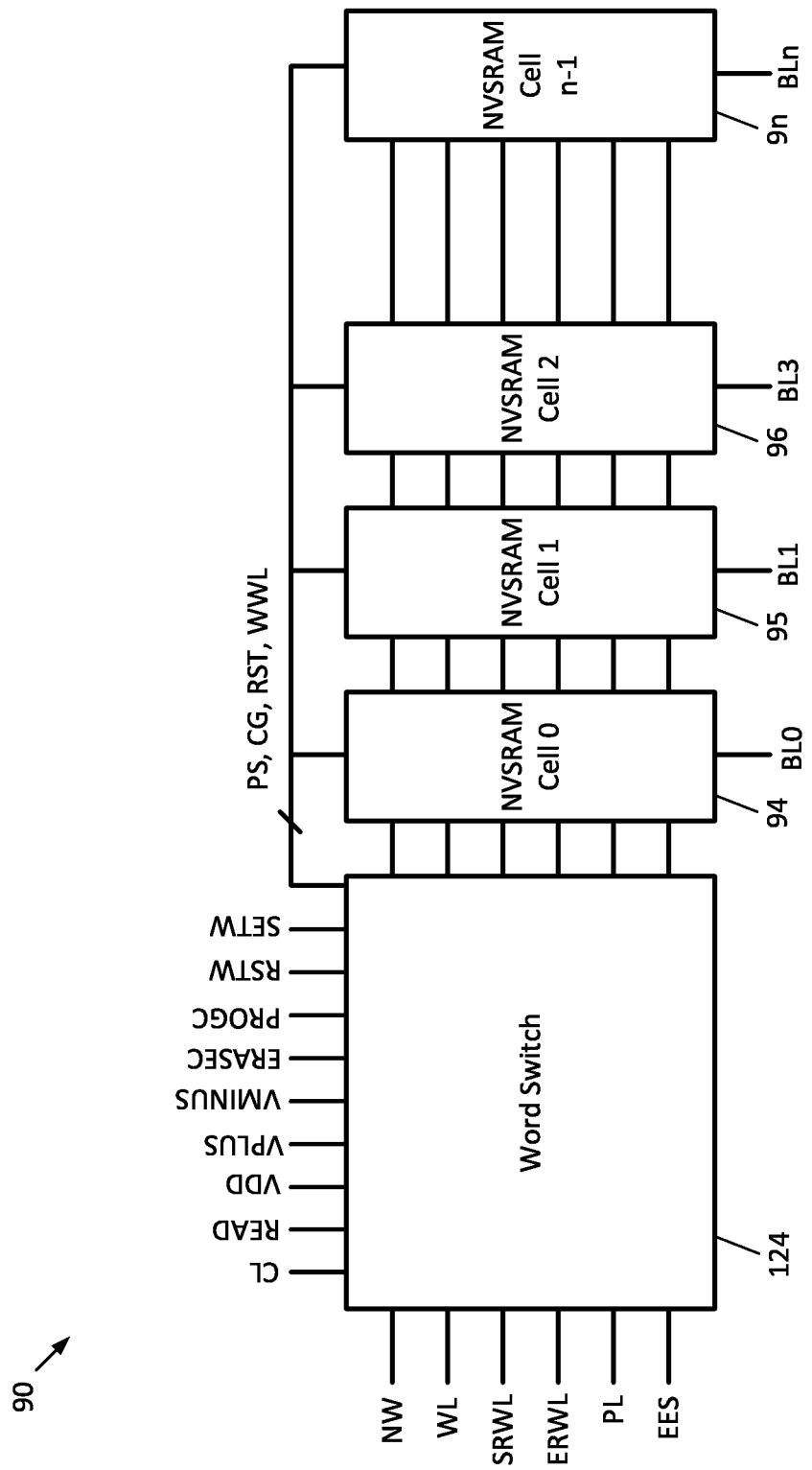
FIG. 9 is a block diagram of a word of an NVSRAM array formed using the word switch circuitry and NVSRAM cells disclosed herein.

A word 90 utilizing the NVSRAM cells 20 or 60 taught above is now described with reference to FIG. 9. Word switch circuitry 124 (which can be either word switch circuitry 28 or word switch circuitry 29) has inputs coupled to the NW, WL, SRWL, ERWL, PL, EES, VDD, VPLUS, VMINUS, ERASEC, PROGC, RSTW, CL, READ, and SETW lines, and provides output to the PS, CG, RST, and WWL lines. Any number of NVSRAM cells 94 . . . 9n are coupled to the word switch 124 and to their respective bitlines BL0 . . . BLn. The word switch circuitry 124 performs the functions as described above so as to facilitate read, write, reload, and store operations performed on and by the NVSRAM cells 94 . . . 9n.

Figure 10:
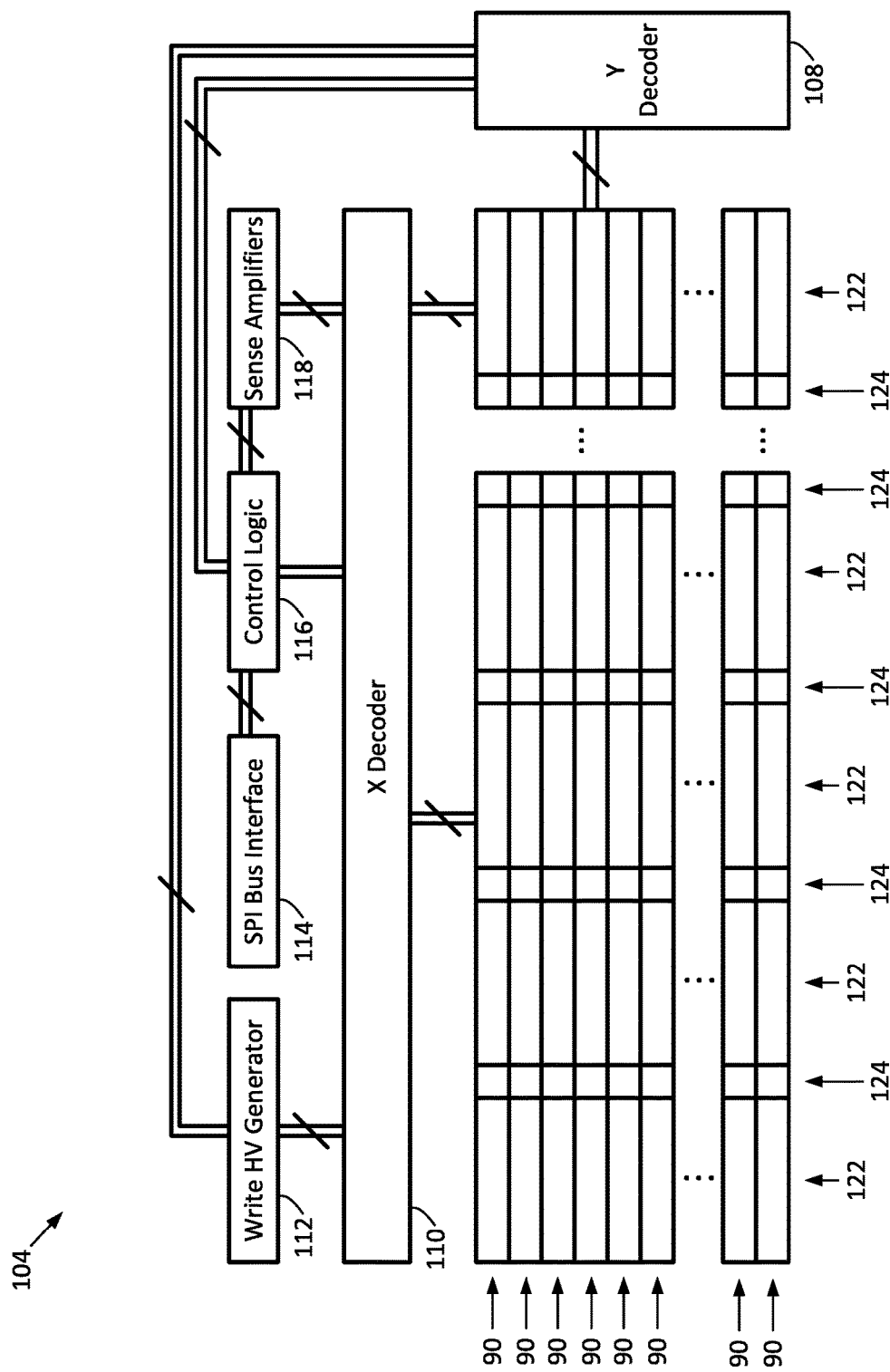
FIG. 10 is a block diagram of a NVSRAM array formed using the word switch circuitry and NVSRAM cells disclosed herein.

A NVSRAM array 104 is now described with reference to FIG. 10. The NVSRAM array 104 includes multiple columns, with each column being comprised of words 90 (having the structure described above). Each word 90 is divided into its constituent bit cells 122 and their respective word switches 124. A row decoder 108 and column decoder 110 receive instructions from control logic 116 and decode addresses within the NVSRAM array 104 accordingly. A write HV generator 112 and sense amplifiers 118 respectively operate during write and read cycles to effectuate writes of data to, and reads of data from, the NVSRAM array 104. The control logic 116 may receive commands (e.g. read, write, reload, and store) via a SPI bus interface 114, and may generate its commands to the row decoder 108 and column decoder 110 based thereupon.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A non-volatile static random access memory (NVSRAM), comprising:
   a NVSRAM cell comprising:
      a static random access memory (SRAM) memory cell;

a first gate selectively directly electrically coupling the SRAM memory cell to a bit line based upon a word level word line signal;

a buffer circuit transferring a logic state of the SRAM memory cell to the bit line based upon a SRAM read word line signal;

a singular electrically erasable programmable read only memory (EEPROM) memory cell having a control terminal receiving a control gate signal;

a second gate selectively directly electrically coupling the singular EEPROM memory cell to the bit line based upon an EEPROM read signal; and a third gate selectively directly electrically coupling the SRAM memory cell to the singular EEPROM memory cell based upon a reload signal; and a power source latch configured to generate a power source signal for powering the SRAM memory cell, wherein the power source latch comprises:

a first latch configured to be set when a reset write signal is at a logic high and to be reset when both of a set signal and a word line for the SRAM memory cell are at a logic high; and an inverter having an input coupled to an output of the first latch;

wherein the power source signal is generated at an output of the inverter.

2. The NVSRAM of claim 1, further comprising a control gate latch configured to generate the control gate signal, the control gate latch configured to be set when either both of an erase signal and the power source signal are at a logic high or when both of a program signal and a complement of the power source signal are at a logic high, the control gate latch configured to be reset when a read signal is at a logic high.

3. The NVSRAM of claim 2, wherein the EEPROM memory cell comprises a floating gate having a gate coupled to the control gate signal.

4. The NVSRAM of claim 1, wherein the singular EEPROM memory cell comprises a floating gate having a gate coupled to the control gate signal.

5. A non-volatile static random access memory (NVSRAM) of claim 2, comprising:
a NVSRAM cell comprising:
a static random access memory (SRAM) memory cell;
a first gate selectively directly electrically coupling the SRAM memory cell to a bit line based upon a word level word line signal;
a buffer circuit transferring a logic state of the SRAM memory cell to the bit line based upon a SRAM read word line signal;
a singular electrically erasable programmable read only memory (EEPROM) memory cell having a control terminal receiving a control gate signal;
a second gate selectively directly electrically coupling the singular EEPROM memory cell to the bit line based upon an EEPROM read signal; and
a third gate selectively directly electrically coupling the SRAM memory cell to the singular EEPROM memory cell based upon a reload signal; and
a power source latch configured to generate a power source signal for powering the SRAM memory cell, wherein the power source latch comprises:
a first latch configured to be set when a reset write signal is at a logic high and to be reset when the word level word line signal is at a logic high; and
an inverter having an input coupled to an output of the first latch;
wherein the power source signal is generated at an output of the inverter.

6. A non-volatile static random access memory (NVSRAM) of claim 1, comprising:
a NVSRAM cell comprising:
a static random access memory (SRAM) memory cell;
a first gate selectively directly electrically coupling the SRAM memory cell to a bit line based upon a word level word line signal;
a buffer circuit transferring a logic state of the SRAM memory cell to the bit line based upon a SRAM read word line signal;
a singular electrically erasable programmable read only memory (EEPROM) memory cell having a control terminal receiving a control gate signal;
a second gate selectively directly electrically coupling the singular EEPROM memory cell to the bit line based upon an EEPROM read signal; and
a third gate selectively directly electrically coupling the SRAM memory cell to the singular EEPROM memory cell based upon a reload signal; and
control logic configured to generate the word level word line signal and a reset signal for selectively resetting the SRAM memory cell as a function of a word line signal for the SRAM memory cell and a signal indicating whether a power source signal for powering the SRAM memory cell is at a logic high.

7. A non-volatile static random access memory (NVSRAM), comprising:
a NVSRAM cell comprising:
a static random access memory (SRAM) memory cell;
a first gate selectively directly electrically coupling the SRAM memory cell to a bit line based upon a word level word line signal;
a buffer circuit transferring a logic state of the SRAM memory cell to the bit line based upon a SRAM read word line signal;
a singular electrically erasable programmable read only memory (EEPROM) memory cell having a control terminal receiving a control gate signal;
a second gate selectively directly electrically coupling the singular EEPROM memory cell to the bit line based upon an EEPROM read signal; and
a third gate selectively directly electrically coupling the SRAM memory cell to the singular EEPROM memory cell based upon a reload signal; and
wherein the SRAM memory cell comprises:
first and second inverters;
wherein an input of the first inverter is coupled to an output of the second inverter;
wherein an input of the second inverter is coupled to an output of the first inverter;
wherein the buffer circuit comprises:
a first buffering transistor having a drain coupled to the bit line, a source, and a gate coupled to a SRAM read word line; and
a second buffering transistor having a drain coupled to the source of the first buffering transistor, a source coupled to ground, and a gate coupled to the output of the first inverter; and
a reset transistor coupled between the output of the first inverter and ground.

8. A non-volatile static random access memory (NVSRAM), comprising:
a NVSRAM cell comprising:
a static random access memory (SRAM) memory cell;

a first gate selectively directly electrically coupling the SRAM memory cell to a bit line based upon a word level word line signal;

a buffer circuit transferring a logic state of the SRAM memory cell to the bit line based upon a SRAM read word line signal;

a singular electrically erasable programmable read only memory (EEPROM) memory cell having a control terminal receiving a control gate signal;

a second gate selectively directly electrically coupling the singular EEPROM memory cell to the bit line based upon an EEPROM read signal; and a third gate selectively directly electrically coupling the SRAM memory cell to the singular EEPROM memory cell based upon a reload signal; and wherein the SRAM memory cell comprises:
first and second inverters;
wherein an input of the first inverter is coupled to an output of the second inverter;
wherein an input of the second inverter is coupled to an output of the first inverter;
wherein the buffer circuit comprises:
a first buffering transistor having a drain coupled to the bit line, a source, and a gate coupled to a SRAM read word line; and
a second buffering transistor having a drain coupled to the source of the first buffering transistor, a source coupled to ground, and a gate coupled to the output of the first inverter; and
wherein the first gate comprises:
a PMOS gate selectively directly electrically coupling the SRAM memory cell to the bit line based upon a complement of the word level word line signal; and
a NMOS gate selectively directly electrically coupling the SRAM memory cell to the bit line based upon the word level word line signal.

9. The NVSRAM of claim 8, further comprising control logic configured to generate the word level word line signal and the complement of the word level word line signal as a function of a word line signal for the SRAM memory cell and a set signal.

10. The NVSRAM of claim 8, wherein the NVSRAM cell further comprises a control gate latch configured to generate the control gate signal.

11. The NVSRAM of claim 10, wherein the control gate latch is configured to be set when both of an erase signal and a power source signal are at a logic high, and is configured to be reset when a read signal is at a logic high.

12. The NVSRAM of claim 10, wherein the control gate latch is configured to be set when both of a program signal and a complement of a power source signal are at a logic high, and is configured to be reset when a read signal is at a logic high.

13. A method of operating a non-volatile static random access memory (NVSRAM), comprising a plurality of words, each of the plurality of words comprising a plurality of NVSRAM cells, each of the plurality of NVSRAM cells comprising a singular SRAM cell and a singular electronically eraseable programmable read only memory (EEPROM) cell, the method comprising steps of:

prior to reading a given word, powering up the NVSRAM but not powering up or initializing any of the plurality of words;

reading a given word by reading each singular EEPROM cell of each of the plurality of NVSRAM cells of the given word, if a given word has not undergone a volatile write command since powerup; and reading the given word by reading each singular SRAM cell of each of the plurality of NVSRAM cells of the given word, if the given word has undergone a volatile write command since powerup;

wherein reading each singular EEPROM cell comprises, for that singular EEPROM cell, coupling the singular EEPROM cell to a bit line through a dedicated EEPROM sense amplifier for that singular EEPROM cell.

14. The method of claim 13, further comprising:
writing data to the singular SRAM cells of the plurality of NVSRAM cells of the given word through a SRAM write interface;
reloading the singular SRAM cells of the plurality of NVSRAM cells of the given word, in response to selection of that given word; and
wherein the reloading is performed by powering the given word and coupling the singular EEPROM cells of the plurality of NVSRAM cells of the given word to respective singular SRAM cells of the plurality of NVSRAM cells of the given word through the SRAM write interface.

* * * * *